April 14, 1964
M. J. HELLSTROM
3,129,354
TRANSISTOR CIRCUIT
Filed Aug. 12, 1960
Fig. I.
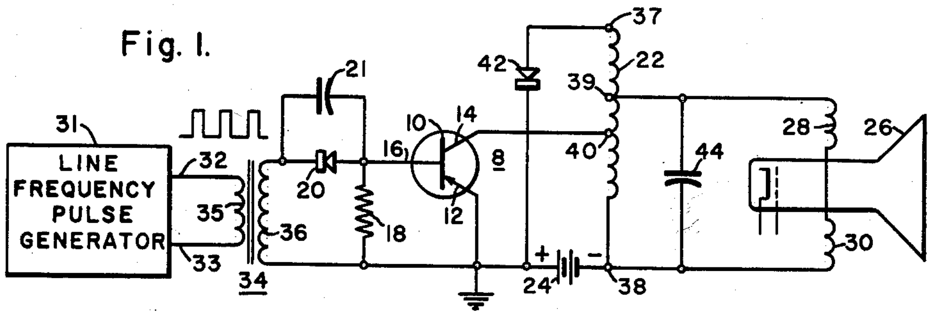
Fig. 2.
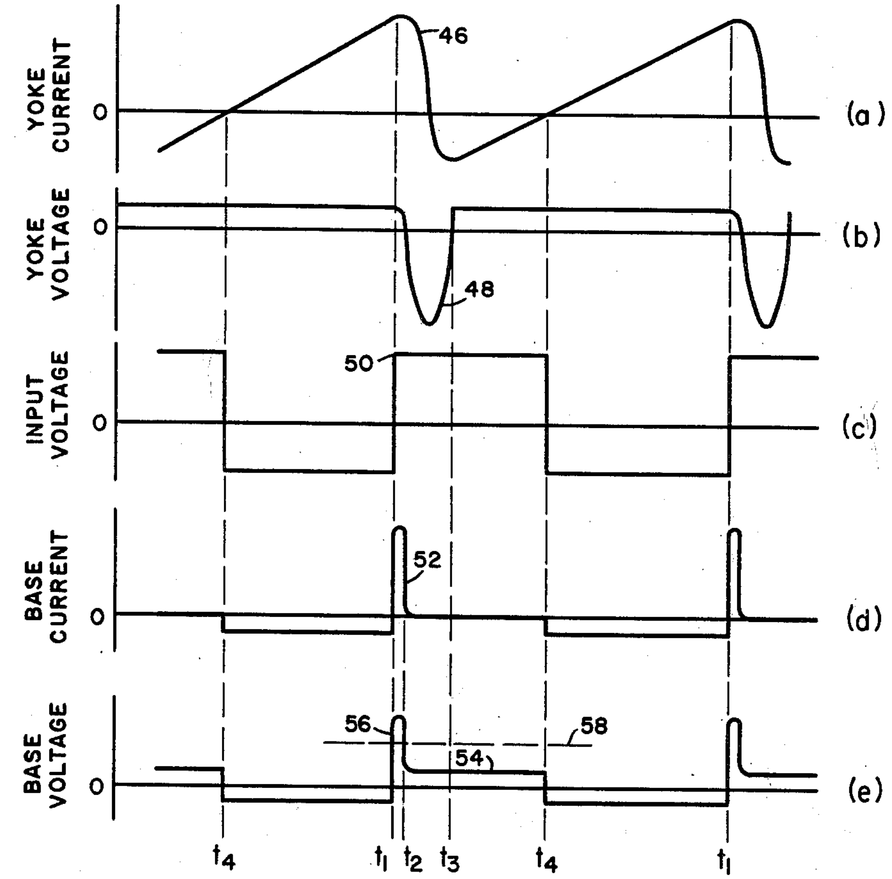
WITNESSES
Wm. B. Sellers.
James F. Young
INVENTOR
Melbourne J. Hellstrom.
BY
Benjamin DeWitt
ATTORNEY 3,129,354
TRANSISTOR CIRCUIT
Melbourne J. Hellstrom, Watchung, N.J., assignor to Westinghouse Electric Corporation, East Pittsburgh, Pa., a corporation of Pennsylvania
Filed Aug. 12, 1960, Ser. No. 49,200
6 Claims. (Cl. 315—27)

The present invention relates in general to transistor circuits and in particular to circuits utilizing transistors as high speed switching and signal amplifying elements.

More particularly, but not necessarily exclusively, the present invention relates to horizontal deflection circuits for cathode ray tube television receivers and the like, and to such circuits utilizing transistors as switching elements for controlling the generation of beam deflection signals.

It is a general object of the present invention to provide an improved circuit arrangement enabling improved switching speed in electrical circuits utilizing semiconductor switching devices.

It is a further general object of the spresent invention to provide an improved high speed switching circuit employing a transistor operating as a pulse actuated switch means.

Although the present invention is applicable to many branches of the electronics art, and may be useful in any instance where it is desired to switch a transistor from a highly conductive condition to a cutoff condition within a time interval of the order of a few microseconds, it perhaps finds no greater useful embodiment than in horizontal deflection circuits for television receivers and the like. Accordingly, the present invention will be illustrated in connection with a cathode ray tube having electromagnetic deflection means and circuitry for applying deflection wave-form currents thereto. It is to be understood that the present invention is in no way limited to the illustrated cathode ray deflection system but may be used in any of various circuit systems wherein occasion may arise for improved high speed switching in response to electrical control signals.

As is well known, sweep current waves for magnetic horizontal or line deflection in cathode ray deflection systems generally must have a saw-tooth wave shape, including a trace portion and a retrace portion with the time duration of the retrace portion being substantially smaller than the duration of the trace portion. For example, the standard television system used in the United States operates on a line scan frequency of approximately 15,750 cycles per second with the duration of the trace period being about 53 microseconds and with the retrace period being about 10 microseconds. To provide the required wave form, many circuit arrangements employing both electron tubes and semiconductor devices have been devised heretofore. The relatively large amount of power consumed in conventional television sets for producing horizontal deflection of the cathode ray has long been a problem. It is well recognized that the power consumed by television receivers, as well as other electronic apparatus, may be substantially reduced by using transistors and other semiconductor devices. In addition, the use of transistors contributes improved reliability of circuit operation and simplicity of the circuit connections and components used.

Attempts to use transistors to accomplish rapid switching at high power level, as required in horizontal deflection systems, have encountered difficulties. Existing commercial power transistors in general have not been designed for the high speed switching required. They turn off more slowly than is desirable in the horizontal deflection application. As a general rule, it is not possible to terminate rapidly the collector current in a typical power transistor by merely reducing the forward base bias to zero. Attempting to cut off the collector current in that manner commonly results in a cutoff time which is longer than the permissible retrace time of the deflection circuit. It has been found that if the cutoff pulse applied to the base of the transistor is of sufficient amplitude to bias it in the reverse direction with respect to the emitter, a transient reverse base current will flow as stored minority carriers are removed from the base region of the transistor. By such rapid removal of the minority carriers in response to a large amplitude reverse cutoff pulse, it is possible to substantially reduce the collector current cutoff time. However, the use of a large amplitude reverse bias pulse to cut off the transistor has certain disadvantages. Firstly, the large pulse of reverse current which flows as a result of the stored minority cariers constitutes an undesirable loading of the pulse source which drives the transistor. Secondly, after the minority carriers are exhausted from the base region, further application of the high reverse voltage pulse may cause breakdown of the base emitter diode with a resultant heavy current flow (perhaps 0.2 to 0.5 ampere) and consequent power dissipation in the transistor as well as loading of the pulse source. This is particularly true of transistors which have low reverse base-emitter breakdown voltage ratings such as the "Diffused Alloy Power" transistors. Further, such reverse breakdown operation of the transistor probably will be detrimental to the device and will probably result in shortened transistor life.

The time period between initial application of a reverse bias pulse to the base electrode of a power transistor and the completion of the collector current cutoff comprises two distinct time periods, the first being the storage time during which the transistor remains saturated and continues to act like a closed switch, and the second being the cutoff time representing the interval during which the collector current decreases to zero.

Presently known circuits for use as the deflection output stage of television receivers utilizing available power transistors of the alloy junction type have been found to require a reverse biasing base pulse on the order of 10 volts or more to achieve an adequately short cutoff time interval. Depending on the particular transistor used, the minority carriers stored in the base region will produce up to several amperes of reverse base current flow during the cutoff process. A typical value might be a 1 ampere pulse of reverse base current for 1 or 2 microseconds in a typical case where the collector current is being reduced to zero from a maximum value of about 5 amperes. Inherent resistance in the base circuit of the output transistor, and in the source of the reverse biasing pulses would ordinarily necessitate a reverse bias control pulse source voltage of the order of 10 volts in order to achieve the desired cutoff time of no more than 3 microseconds.

Heretofore, the realtively large amount of drive power needed to make power transistors cut off sufficiently fast has frequently led to the use of an additional transistor amplifier stage between the line frequency oscillator and the horizontal output stage. The use of such an additional amplifier stage is undesirable in that it contributes to the expense and complexity of the system while somewhat depreciating the overall reliability.

Accordingly, it is a further object of the present invention to provide an improved circuit arrangement in which a transistor is utilized as a controlled pulse actuated switch for delivering current to a load during a predetermined interval, and in which the transistor is turned off at the end of said interval in a fast and efficient manner requiring substantially reduced control pulse power.

It is an additional object of the present invention to provide an improved switching circuit of the aforesaid type employing a transistor in common emitter configuration and having a control signal input circuit arranged for quickly removing charge carirers from the base region of the transistor without unnecessarily subjecting the same to high reverse base voltages.

It is another object of the present invention to provide an improved saw-tooth wave generator for cathode ray deflection systems in which a transistor is utilized as switch means for delivering current to an inductive load during a trace interval and for quickly and efficiently interrupting said current during the initial time portion of a retrace interval.

It is a still further object of the present invention to provide improved turn off speed in switching circuits utilizing junction transistor switching devices which have the property of storing a minority carrier base charge during intervals when the base emitter junction is forwardly biased.

By way of example, the foregoing and other objects of the present invention are achieved in a circuit arrangement which includes a junction transistor having its output circuit coupled to a generally conventional flyback transformer and deflection yoke circuit arrangement. In accordance with the invention, the base-emitter current path of the transistor is connected in series with an asymmetrically conductive diode which has the characteristics of storing a minority carrier charge when forwardly biased. The series combination of the base emitter path and the diode is connected across the output terminals of a reverse biasing pulse source, such as a conventional horizontal deflection multivibrator or other oscillator circuit. The reverse biasing pulses provided at the output of the pulse source are of an amplitude greater than the reverse breakdown voltage of the base emitter path through the transistor. The diode is poled in the same direction as the base emitter junction of the transistor and hence will not interfere with the normal operation during the time when the transistor is forwardly biased. The diode has a carrier storage characteristic similar to that of the transistor. Accordingly, when a reverse biasing pulse is applied across the series combination, the diode initially presents a low impedance so that the pulse passes therethrough and is applied across the transistor base emitter current path. The stored charges of the transistor and the diode are exhausted serially and simultaneously. Accordingly, as the transistor approaches cutoff, the diode reverse impedance increases and most of the reverse biasing pulse will thereafter be applied across the diode so that reverse breakdown of the transistor is prevented and unnecessary loading of the pulse source during the remainder of the pulse duration is avoided.

The novel features that are considered characteristic of this invention are set forth with particularity in the appended claims. The invention itself, however, both as to its organization and method of operation, as well as additional objects and advantages thereof, will best be understood from the following description, when read in connection with the accompanying drawing, in which:

FIGURE 1 is a schematic circuit diagram of a television receiver horizontal deflection system embodying the invention; and FIGURE 2 is a plurality of graphs serving to illustrate the different voltage and current relationships in the circuitry of FIGURE 1 during the different time intervals throughout the cycle of operation.

Referring now to the drawing, a transistor 8 may be considered to be, by way of example, a junction transistor of the p-n-p type and include a semiconductive body 10 with which an emitter 12, a collector 14 and base electrode 16 are cooperatively associated in a well known manner. While the transistor 8 is of the junction type, it may be of any other suitable type having characteristics which are similar to those of junction type transistors. In addition, while the transistor has been chosen to be of the n-type conductivity for the purposes of explanation, it should be understood that it could be of p-type conductivity, if the polarities of the biasing sources were reversed and the polarity of the input signal were reversed. The transistor 8 is connected in the so called common emitter configuration, the emitter 12 being connected directly to a point of reference potential or ground for the circuit and being common to the input and output circuits. The base 16 serves as the input electrode and is connected through a resistor 18 to the emitter electrode 12. If so desired, the lower end of resistor 18 may be connected to the negative terminal of a source of direct current potential such as a battery (not shown) with the positive terminal of the battery being connected to ground. Persons skilled in the art will recognize that such a fixed bias arrangement is a conventional method of normally biasing the transistor 8 into saturation, that is, establishing the emitter to base current at the level to render the emitter-collector circuit wholly conductive. The collector 14 of the transistor 8 is connected to an intermediate terminal 40 on an inductor 22, the lower end of which is connected at terminal 38 to the negative terminal of a source of direct current biasing potential as illustrated by the battery 24. The tapped inductor 22 may be considered to be an autotransformer, such as the conventional flyback transformers commonly used in television deflection circuits. The upper end terminal 37 of the inductor 22 is connected to the anode of a damper diode 42 which may be a conventional p-n junction diode, various types of which are known in the art. The cathode electrode of damper diode 42 is connected to the positive terminal of biasing source 24 and to the emitter electrode 12. A further intermediate terminal 39 on the inductor 22 is connected to one end of an inductive winding 28, such as one of a set of deflection windings of the electromagnetic deflection yoke conventionally associated with the cathode ray tube or picture reproducing device 26 of a television receiving system. For purposes of illustration, the deflection winding has been shown separated into two inductive windings 28 and 30 connected in series between the terminals 39 and 38 of inductor 22. The lower end of the deflection winding 30 is connected to the lower end terminal 38 of the inductor 22 and hence to the negative terminal of the battery 24. The series connected deflection coils 28 and 30 are shunted by a retrace capacitor 44 connected between the terminals 39 and 38 of inductor 22. It will be readily appreciated by persons skilled in the art that the retrace capacitor 44 need not be connected to the same terminals of the inductor 22 as are the deflection yoke winding 28 and 30, but if so desired may be shunted across an entirely different portion of the inductor 22 with the capacitance of capacitor 44 being correspondingly readjusted.

The output circuit of transistor 8, comprising inductor 22 and deflection yoke windings 28 and 30 coupled to the external collector emitter current path of transistor 8, is a generally conventional energy recovery deflection circuit, and accordingly will not be described in further particular detail. It will be appreciated by persons skilled in the art that the arrangement and interconnection of inductor 22 with damper diode 42 and the sweep circuit comprising inductors 28 and 30 and capacitor 44 may be rearranged in various ways without departing from the scope of this invention.

In accordance with the present invention, the input circuit for applying switching pulses to the transistor 8 comprises an asymmetrically conductive semiconductor diode 20 having its anode connected to the base electrodes 16 of transistor 8 and having its cathode terminal connected to one end of a secondary winding 36 of pulse transformer 34. The other end terminal of the secondary winding 36 is connected to ground and hence to the emitter electrode 12. Line scanning frequency pulses are supplied to the deflection circuit from a pulse generator 31 which may comprise any of various well known multivibrator or oscillator circuits. One such line frequency pulse generator or horizontal multivibrator is described in detail in my copending patent application Serial No. 70,567, filed November 21, 1960 and entitled "Deflection Circuit."

The output terminals 32 and 33 of pulse generator 31 are connected to the opposite ends of a primary winding 35 of coupling transformer 34. Generator 31 together with transformer 34 comprises means for alternately applying positive-going and negative-going voltage pulses across the series circuit combination comprising semiconductor diode 20 and the base-emitter current path of transistor 8. In accordance with the present invention, the diode 20 preferably has the characteristic of storing minority carrier charge when forwardly biased with the charge stored thereby being of the same order of magnitude as the charge stored in the base region of transistor 8 when it is forwardly biased.

In the preferred embodiment of the invention the charge storage capacity of diode 20 is approximately equal to that of the base region of transistor 8. In the event that the diode 20 does not have sufficient inherent charge storage capacity, it may be shunted by a capacitance 21 in the form of a conventional capacitor. Care should be exercised to insure that the supplementary capacitor 21 is not too large. If the combined charge storage capacity of diode 20 and capacitor 21 substantially exceeds the charge storage of the base region of transistor 8, reverse breakdown of the base-emitter path may occur during the retrace interval. Resistor 18, connected between base electrode 16 and emitter electrode 12, is optional. It is believed that the base-to-emitter resistor 18 when used with alloy junction transistors, will enhance the ability of the collector base junction to withstand high inverse voltage. The resistor 18 may not be necessary with certain other transistors which may be utilized in accordance with the invention.

The operation of the circuit shown in FIGURE 1 is described with relation to FIGURE 2 in which the various designated currents and voltages during one cycle of operation are represented as ordinates in the graphs (*a*), (*b*), (*c*), (*d*), and (*e*). The abscissa in each of the graphs is time and the same time interval in each of the curves is correlated by the vertical lines to designate a first time interval $t_1$–$t_2$; a second time interval $t_2$–$t_3$; a third time interval $t_3$–$t_4$; and a fourth time interval $t_4$–$t_1$.

To fully appreciate the operation and advantages of the deflection system of the present invention, it is desirable to have a full understanding of the requirements of the deflection yoke comprising coils 28 and 30. During the latter portion of the trace interval as indicated by time $t_4$–$t_1$ of FIGURE 2, transistor 8 is conductive so that the collector voltage with respect to the emitter is substantially zero and the total voltage of energizing source 24 is applied to inductor 22. Accordingly, the collector current flowing through the inductor 22 builds up linearly and reaches a maximum value just prior to the time when the transistor 8 is cut off. When transistor 8 is turned off, the inductive energy stored primarily in coils 28 and 30 causes a half cycle of oscillation involving the deflection coils 28 and 30 and the retrace capacitor 44 together with the stray capacitances of the flyback transformer and circuit. The approximately cosinusoidal oscillatory half cycle of current in the deflection coils is shown by portion 46 of graph (*a*) as occurring during time $t_1$–$t_3$. The deflection coil voltage and hence the voltage across retrace capacitor 44 is shown by graph (*b*), in which the pulse 48 indicates that the retrace capacitor reaches full charge near the middle of the retrace period $t_1$–$t_3$ and thereafter discharges as reverse current builds up in the deflection coils. At the time $t_3$, damper diode 42 becomes conductive thereby preventing further oscillation in the deflection circuitry. During the first half of the trace interval as indicated by the time interval $t_3$–$t_4$, energy stored in the inductances of the sweep circuit is returned via the flyback transformer 22 to the source 24 by current flow through the damper diode 42.

From the foregoing brief description of the sweep circuit operation, it will be appreciated that transistor 8 must be quickly and completely rendered non-conductive as soon as possible after the time $t_1$ corresponding to the beginning of the retrace interval. This interval during which the transistor collector current drops to zero is $t_1$–$t_2$. The present invention assures the desirable short cutoff time by providing a reverse biasing pulse 50 as shown in graph (*c*) of FIGURE 2. To accomplish this the output pulses 50 from generator 31 must have a sufficiently large magnitude. In the case of some types of transistors, e.g., "diffused alloy," the output pulses 50 substantially exceed the reverse breakdown voltage of the base-emitter junction of transistor 8. When the pulse 50 is applied from secondary winding 36 to the series combination comprising diode 20 and the base emitter junction, there occurs a surge of reverse base current flow out of the base 16 and through diode 20. The pulse of reverse base current as indicated at 52 in graph (*d*) represents the minority carrier charge which was stored in the base region of the transistor 8. Since diode 20 has a similar charge storage characteristic, it presents a low impedance to the reverse base current during the time interval $t_1$–$t_2$. Accordingly, during interval $t_1$–$t_2$, a relatively high voltage as shown by the pulse 56 in graph (*e*) is applied across the base-emitter junction, thereby rapidly exhausting the minority carrier charge from the base region. When the base charge is fully removed, the transistor becomes non-conductive and the collector current has been reduced to zero. Simultaneously, diode 20 has had its stored charge removed and thereafter presents a high impedance to reverse base current so that the pulse voltage across diode 20 increases and the pulse voltage across the base-emitter junction decreases to the level shown at 54 in curve (*e*). The reverse breakdown voltage of the base-emitter junction is shown diagrammatically by the dotted line 58 in graph (*e*). It may be observed that as soon as the transistor and diode 20 are fully cut off, the voltage across the base-emitter junction of the transistor is reduced to a level 54 which is less than the reverse breakdown voltage of the junction. Accordingly, during the remainder of the retrace period, $t_2$–$t_3$, the reverse voltage applied to the base of transistor 8 is maintained at a value less than the reverse breakdown potential, thereby avoiding unnecessary power dissipation in the transistor 8 and relieving the pulse generator 31 of the unnecessary loading which would be created by reverse breakdown of transistor 8 during the period of pulse 50.

The improved circuit arrangement of the present invention, as set forth above, has been found to be particularly desirable when used with power transistors made by the diffused alloy process. Such transistors have many desirable features for cathode ray deflection output circuits. Among other things, they have a higher switching speed than conventional alloy junction transistors of equally high power rating. However, the diffused alloy transistor has the characteristic of a low base emitter breakdown voltage. When such a diffused alloy transistor was used in a circuit similar to that of the present invention but not having the diode 20, it was found that the reverse biasing pulse 50 would cause reverse breakdown of the diffused alloy base emitter junction and a reverse base current typically on the order of 0.2–0.5 ampere would flow through the base-emitter junction. Provision of the diode 20 poled in the same direction as the base emitter junction and connected serially therewith was found to prevent the foregoing undesirable breakdown, while at the same time providing for the desired high speed switching of the transistor from saturation to cutoff. An additional advantage of the circuit of the present invention is that diode 20 prevents "turning-on" of the collector base diode of the transistor at the time of the firing of the damper diode 42.

While it will be understood that the circuit specifications may vary according to the design for any particular application, the following circuit component values are included for the circuit of FIGURE 1 by way of example:

| | |
|---|---|
| Transistor 8 | B–1085 (Bendix). |
| Voltage source 24 | 12 volts. |
| Diode 20 | High current alloy junction. |
| Resistor 18 | 20 ohms. |
| Output voltage of pulse source 31 | 2 volts peak-to-peak. |

The foregoing component values are given by way of example only, and it is to be understood that the present invention is not limited to the given circuit component parameters.

While the present invention has been shown in one form only, it will be obvious to those skilled in the art that it is not so limited but is susceptible of various changes and modifications without departing from the spirit and scope thereof.

I claim as my invention:

1. A controllable switching circuit comprising in combination a transistor including base emitter and collector electrodes, with the base-emitter junction thereof exhibiting storage of minority carrier charge when forwardly biased and requiring removal of said charge as a precedent to turning off the collector current, an asymmetrically conducting diode connected in series with and poled in the same direction as said junction to normally provide a low resistance path for base emitter current, control signal input means connected across the series combination of said junction and said diode for periodically providing reverse biasing voltage pulses having amplitudes exceeding the reverse breakdown voltage of said junction, and said diode having a minority carrier recovery time of the same order of magnitude as the minority carrier recovery time of said base-emitter junction.

2. A high speed switching circuit comprising a transistor having base emitter and collector electrodes with said base and emitter defining an asymmetrically conductive junction which exhibits the properties of storing minority carriers when forwardly biased and producing when reverse biased a short duration reverse base current flow representing removal of the stored carriers, an asymmetrically conducting semiconductor diode exhibiting a generally similar minority carrier charge storage characteristic, said diode being connected in series with and poled similarly as the base emitter junction of said transistor to normally provide a low resistance path for base emitter current, input means coupled to the series circuit comprising said diode and said junction for alternately applying forward biasing and reverse biasing voltage pulses to said transistor to render the same alternately operative and inoperative, said reverse biasing voltage pulses having amplitudes exceeding the reverse breakdown voltage of said junction, and said diode having a minority carrier recovery time substantialy equal to the minority carrier recovery time of said base emitter junction.

3. A high speed switching circuit comprising a transistor having base, emitter, and collector electrodes with said base and emitter defining an internal asymmetrically conductive junction which exhibits the properties of storing minority carriers when forwardly biased and producing when reversely biased a short duration reverse base current flow representing removal of the stored carriers, an asymmetrically conducting diode exhibiting a generally similar minority carrier charge storage characteristic, said diode being connected in series with and poled similarly as the base emitter junction of said transistor to normally provide a low resistance path for base emitter current, input means coupled to the series circuit comprising said diode and said junction for alternately applying forwardly biasing and reversely biasing voltage pulses to said transistor to render the same alternately operative and inoperative, said reversely biasing voltage pulses having amplitudes exceeding the reverse breakdown voltage of said junction, said diode and said base emitter junction operating during each of said reversely biasing pulses to present a relatively low impedance to reverse base current during an initial time interval and a higher impedance during a later interval so that the reverse bias voltage applied to said junction during said later interval is less than said reverse breakdown voltage, means for biasing the collector electrode in the reverse direction, and signal output means coupled with said collector electrode.

4. In a cathode ray beam deflection system: a transistor having base, collector, and emitter electrodes; beam deflection means comprising a reactive impedance coupled to the collector circuit of said transistor; means for applying operating potential to said collector electrode; and means for periodically altering the conductivity condition of said transistor, said last-mentioned means comprising a pulse source having an output circuit providing periodic output pulses of a polarity to render said transistor non-conductive and having pulse amplitudes substantially exceeding the reverse breakdown voltage of the base emitter junction; an asymmetrically conducting semiconductor diode connected to said output circuit in series with and poled in the same direction as said junction to normally provide a low resistance path for base emitter current, said base-emitter junction having the property of storing a minority carrier base charge dependent upon the forward bias applied thereto during conducting intervals and said diode exhibiting a charge storage capacity of the same order of magnitude so that during each applied pulse said diode presents a low impedance to reverse base current until the stored base charge is substantially exhausted and thereafter presents a high impedance to reverse base current flow.

5. In a cathode ray deflection system, the combination with a transistor having base, emitter and collector electrodes, of means providing biasing potential for said transistor effectively connected between said collector and base electrodes, transformer means having at least one inductive winding, means connecting said winding with said collector electrode, an electromagnetic deflection coil coupled with said winding and comprising an output load for signals in said collector circuit, a pulse source having an output circuit providing periodic output pulses of a polarity to render said transistor nonconductive and having pulse amplitudes substantially exceeding the reverse breakdown voltage of the base-emitter junction, an asymmetrically conducting semiconductor diode connected to said output circuit in series with and poled to conduct in the opposite direction from the base-collector junction to normally provide a low resistance path for base emitter current, said base-emitter junction having the property of storing a minority carrier base charge dependent upon the forward bias applied thereto during conducting intervals and said diode exhibiting a charge storage capacity of the same order of magnitude so that during each applied pulse said diode presents a low impedance to reverse base current until the stored base charge is substantially exhausted and thereafter presents a high impedance to reverse base current flow.

6. A deflection wave generator circuit comprising in combination a semiconductor device having base, emitter and collector electrodes and providing a base-emitter path which is asymmetrically conducting and which exhibits minority carrier charge storage when forwardly biased and transient current removal of said charge when reversely biased, an asymmetrically conducting device having a high current alloy junction connected in series with and poled similarly as said base-emitter path and providing substantially the sole external direct current path for currents flowing to the base electrode, means for biasing the collector in the reverse direction relative to the emitter, signal output means coupled with said collector electrode, signal input means connected across the series combination of said base-emitter path and said asymmetrically conducting device for applying reverse biasing pulses to render said semiconductor device periodically nonconductive, said reverse biasing pulses having magnitudes exceeding the reverse breakdown voltage of said base-emitter path, and said asymmetrically conducting device exhibiting minority carrier charge storage of the same order of magnitude as the charge storage of said semiconductor device, thereby permitting application of each of said reverse biasing pulses to said semiconductor device until the minority carrier charge is removed therefrom and thereafter limiting the reverse voltage applied to said semiconductor device to less than said reverse breakdown voltage.

References Cited in the file of this patent

UNITED STATES PATENTS

| | | |
|---|---|---|
| 2,810,080 | Trousdale | Oct. 15, 1957 |
| 2,814,736 | Hamilton | Nov. 26, 1957 |
| 2,926,284 | Finkelstein et al. | Feb. 23, 1960 |
| 2,982,869 | Cagle | May 2, 1961 |

FOREIGN PATENTS

| | | |
|---|---|---|
| 223,253 | Australia | Aug. 3, 1959 |